United States Patent
Ando et al.

[11] Patent Number: 5,836,676
[45] Date of Patent: Nov. 17, 1998

[54] LIGHT EMITTING DISPLAY APPARATUS

[75] Inventors: Akira Ando; Mitsuji Sekine, both of Tokyo, Japan

[73] Assignee: Koha Co., Ltd., Tokyo, Japan

[21] Appl. No.: 779,202

[22] Filed: Jan. 6, 1997

[30] Foreign Application Priority Data

| May 7, 1996 | [JP] | Japan | 8-112748 |
| May 7, 1996 | [JP] | Japan | 8-112749 |

[51] Int. Cl.⁶ ................................................. F21V 5/00
[52] U.S. Cl. .................... 362/244; 362/231; 362/251; 362/800; 313/500; 40/444
[58] Field of Search ........................... 40/444, 451, 452, 40/544, 581; 313/500, 501, 510; 362/230, 231, 234–237, 244, 251, 295, 800

[56] References Cited

U.S. PATENT DOCUMENTS

| 3,805,049 | 4/1974 | Frank et al. | 40/581 |
| 3,816,739 | 6/1974 | Stolov | 40/581 |
| 3,875,456 | 4/1975 | Kano et al. | 313/501 |
| 3,924,227 | 12/1975 | Stolov | 313/510 |
| 4,615,607 | 10/1986 | Yanagawa et al. | 399/231 |
| 4,734,619 | 3/1988 | Havel | 313/510 |
| 4,810,937 | 3/1989 | Havel | 313/510 |
| 5,184,114 | 2/1993 | Brown | 345/83 |
| 5,410,345 | 4/1995 | Eichenlaub | 348/59 |
| 5,450,301 | 9/1995 | Waltz et al. | 362/231 |
| 5,576,825 | 11/1996 | Nakajima et al. | 356/71 |
| 5,724,062 | 3/1998 | Hunter | 345/102 |

*Primary Examiner*—Alan Cariaso
*Attorney, Agent, or Firm*—Helfgott & Karas, PC.

[57] ABSTRACT

A light emitting display apparatus has pixels arranged in rows to display a predetermined image, each of the pixels being composed of red and green, or blue and yellow light emitting diodes, lenses provided on the pixels, each of the lenses horizontally diffusing lights emitted from the red and green, or blue and yellow light emitting diodes, and vertically diverging the lights, a driver for driving the red and green, or blue and yellow light emitting diodes to be turned on in accordance with predetermined light intensities, thereby representing various colors including a white color. In the light emitting display apparatus, therefore, the displayed image is easy to be recognized, the number of the LEDs and the power consumption are decreased, and the density of pixels is increased. Further, the image information of the white color is displayed without the three original color light emitting diodes, that is, red, green and blue light emitting diodes, and the color of an image information is selectable from a variety of colors which include a white color.

11 Claims, 20 Drawing Sheets

FIG. 19

PROFILE OF X-Y PLANE
FOR Z=0

$$\frac{X^2}{3.75^2} + \frac{Y^2}{3.1^2} = 1$$

GATE CUT PLACE

GATE 6.2

7.5

5, 5b, 5a

PROFILE OF Xz-Yz PLANE OF ANY PLACE
OF Z BEING PARALLEL TO X-Y PLANE $$\frac{Xz^2}{3.75^2 - (Z-0.45)^2} + \frac{Yz^2}{3.1^2 \left(1 - \frac{Z^2}{4.2^2}\right)} = 1$$

PROFILE OF X-Z PLANE
FOR Y=0
$(Z-0.45)^2+X^2=3.75^2$
$Z=0\sim0.45$, OR $Z=0.45$

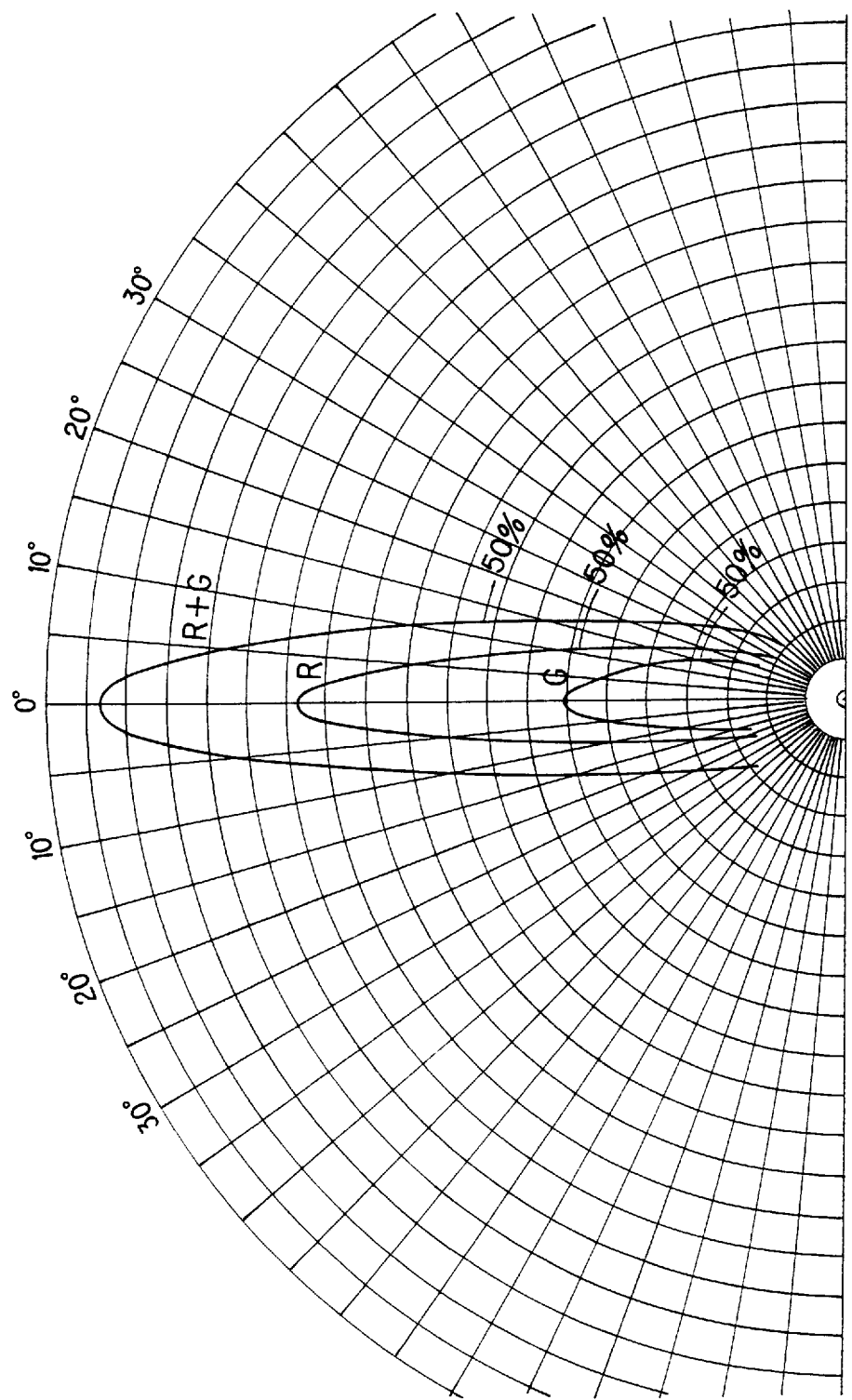

LIGHT EMITTING DISPLAY APPARATUS

FIELD OF THE INVENTION

The invention relates to a light emitting display apparatus, and more particularly to, a light emitting display apparatus used for a display such as a type of a standing signboard, structured by LEDs (Light Emitting Diodes), which light colors are blue and yellow, or (bluish-)green and red, layouted at a specific pattern such as a matrix pattern, and displaying an image such as a word character, a numerical character and/or a symbol character by lighting the LEDs to a specific color such as white or other colors by controlling a luminous intensity ratio of blue and yellow, or (bluish-)green and red.

BACKGROUND OF THE INVENTION

A conventional light emitting display apparatus comprises pixels arranged in matrix, wherein each pixel is composed of three light emitting diodes of red, green and blue.

In the conventional light emitting display apparatus, full colors are represented by controlling the turning on and off, or the light intensities of the red, green and blue light emitting dioeds.

In the conventional light emitting display apparatus, however, there are disadvantages in that the reduction of cost is difficult, the density of pixels is lowered, and the amounts of heat generated and power consumed by the light emitting diodes are large, because each pixel is composed of the red, green and blue light emitting diodes. In addition, a displayed image is hard to be recognized, when a screen is directly radiated by the sun, or the surrounding is bright, because the light intensities of the red, green and blue light emitting diodes are not so high.

SUMMARY OF THE INVENTION

Accordingly, it is an object of the invention to provide a light emitting display apparatus in which the displayed image is easy to be recognized.

It is another object of the invention to provide a light emitting display apparatus in which the number of the LEDs and the power consumption are decreased, and the density of pixels is increased.

It is a further object of the invention to provide a light emitting display apparatus in which an image information of the white color is displayed without the red, green and blue light emitting diodes.

It is an even further object of the invention to provide a light emitting display apparatus in which the color of an image information is selectable from a variety of colors which include a white color.

According to the first feature of the invention, a light emitting display apparatus, comprises pixels arranged in rows to display a predetermined image, each of the pixels being composed of one or more light emitting diodes, and lenses provided on the pixels, each of the lenses horizontally diffusing lights emitted from the light emitting diodes, and vertically diverging the lights.

According to the second feature of the invention, a light emitting display apparatus, comprises pixels to display a predetermined image, each of the pixels being composed of red and green light emitting diodes, and means for driving the red and green light emitting diodes to be turned on in accordance with predetermined light intensities, thereby representing various colors including a white color.

According to the third feature of the invention, a light emitting display apparatus, comprises pixels to display a predetermined image, each of the pixels being composed of blue and yellow light emitting diodes, and means for driving the blue and yellow light emitting diodes to be turned on in accordance with predetermined light intensities, thereby representing various colors including a white color.

BRIEF DESCRIPTION OF THE DRAWINGS

The invention will be described in more detail in conjunction with the accompanying drawings, wherein:

FIG. 19 is a sectional view of a lens of the present invention and is taken along the X-Y plane;

FIG. 24 is a diagram of the directional pattern of the lens of the present invention and is taken along the vertical plane.

DETAILED DESCRIPTION OF THE PREFERRED EMBODIMENTS

Before explaining a light emitting display apparatus in the preferred embodiment according to the invention, the above mentioned conventional light emitting display apparatus will be explained in FIGS. 1 and 2.

Figure 1:
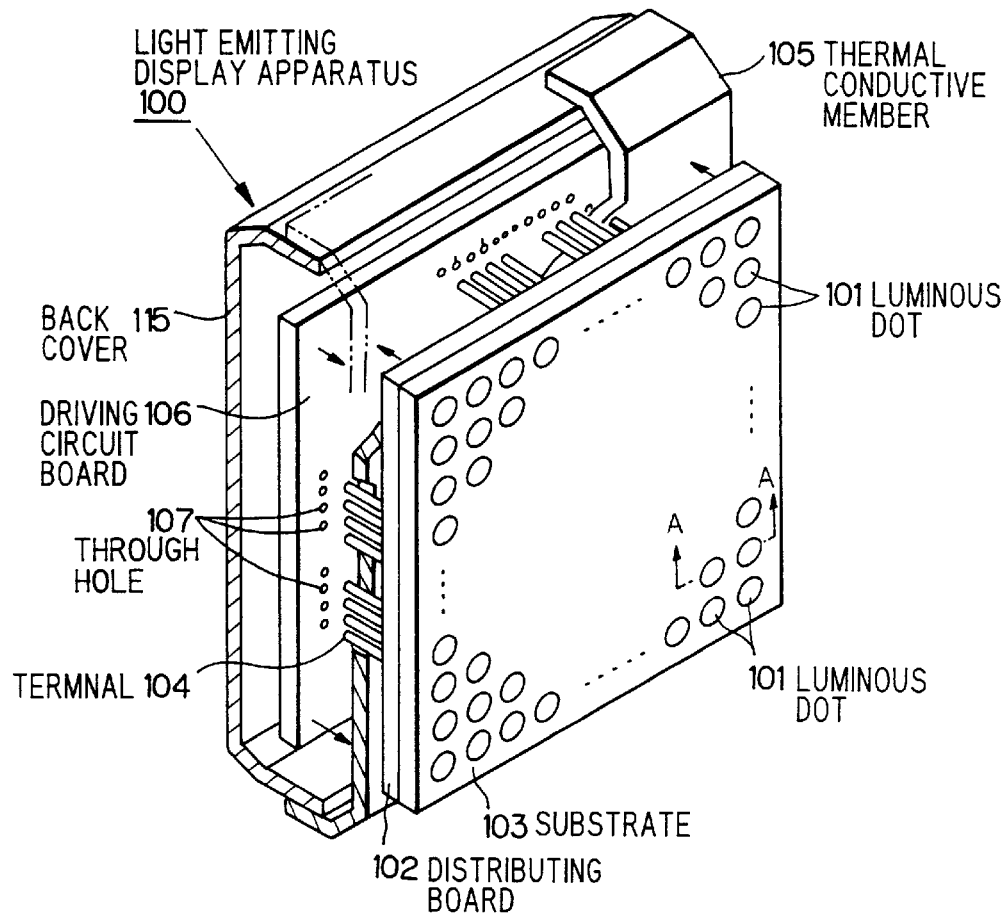
FIG. 1 is a perspective view of a conventional light emitting display apparatus.

FIG. 1 is a perspective view of a conventional light emitting display apparatus. In FIG. 1, the conventional light emitting display apparatus 100 includes luminous dots (bodies) 101, a substrate 103, terminals 104, a thermal conductive member 105, a driving circuit board 106 and a distributing board 102. The luminous bodies 101 are formed in matrix on the distributing board 102. The distributing board 102 is placed on the substrate 103. The terminals 104 for connecting the distributing board 102 with a driving circuit board 106 are provided at the rear of the distributing board 102, and the thermal conductive member 105 insulated to a pattern of the distributing board 102 is placed at the rear of the distributing board 102. The driving circuit board 106 is placed at the rear of the thermal conductive member 105. The driving circuit board 106 has through holes 107 into which the terminals 104 are inserted. A back cover 115 is connected to the thermal conductive member 105.

Figure 2:
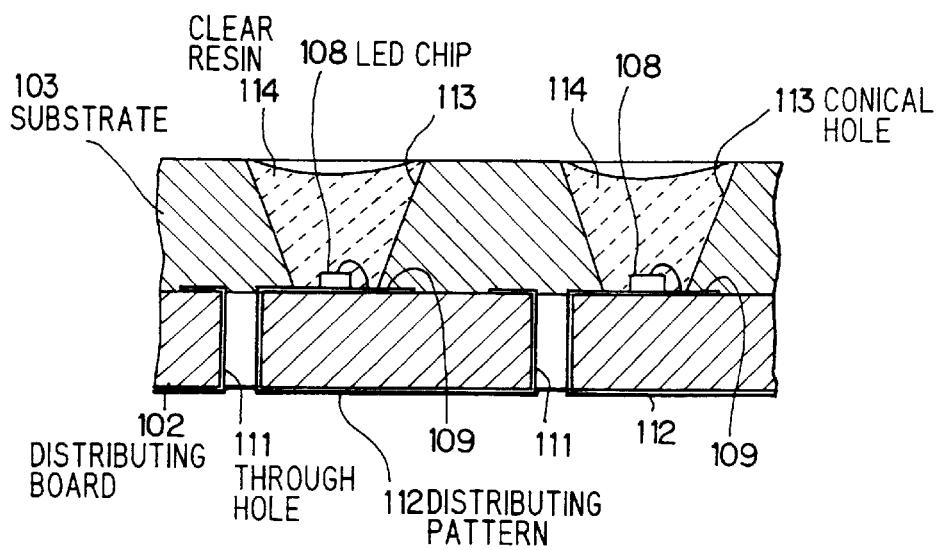
FIG. 2 is an enlarged cross sectional view of the conventional light emitting display apparatus and is taken along the line A—A of FIG. 1.

FIG. 2 is an enlarged cross sectional view of the conventional light emitting display apparatus and is taken along the line A—A of FIG. 1. Each of the LED chips 108 is placed on a corresponding one of predetermined points of a surface of the distributing board 102. An electrode of the LED chip 108 is connected with a distributing pattern 109 on the distributing board 102 by a bonding wire, and another electrode of the LED chip 108 is connected via a through hole 111 with a distributing pattern 112.

Conical holes 113 are formed around the LED chips 108 on the substrate 103. A transparent resin 114 is molded in the conical hole 113 to provide a concave lens.

Further, each of the LEDs is turned on to be red (R), green (G) or blue (B) color. And the conventional light emitting display apparatus has a light sensor for detecting a surrounding luminous intensity and a driving circuit for driving the LED according to a detecting signal from the light sensor.

In the conventional light emitting display apparatus, the driving circuit board 106 is connected with a power source, so that the LED chips 108 which are driven by the control circuit of the driving circuit board 106 are turned on. An output light of the LED is radiated to be expanded, so that its light partly forming a displaying image can be recognized not only from the front thereof but also from the slant direction thereof, because the cross section of the conical hole 113 is expanding to the surface of the substrate 103.

Further, the LED light is high power output light, namely, the LED is high luminous type, so that the LED generates a large amount of heat when it is driven. The heat is transmitted to the thermal conductive member 105 and radiates from the thermal conductive member 105 and the back cover 115. Thus, heating up the LED is prevented by the radiation.

Further, the conventional light emitting display apparatus is controlled not to drive the LED chip of blue color, and a specific color is displayed by driving the LED chips of red and green when the surroundings are bright. On the other hand, a white color is displayed by driving the LED chips of red, green and blue colors when the surroundings are dark.

Next, a light emitting display apparatus in the first preferred embodiment according to the present invention will be explained in FIGS. 3 to 24.

Figure 3:
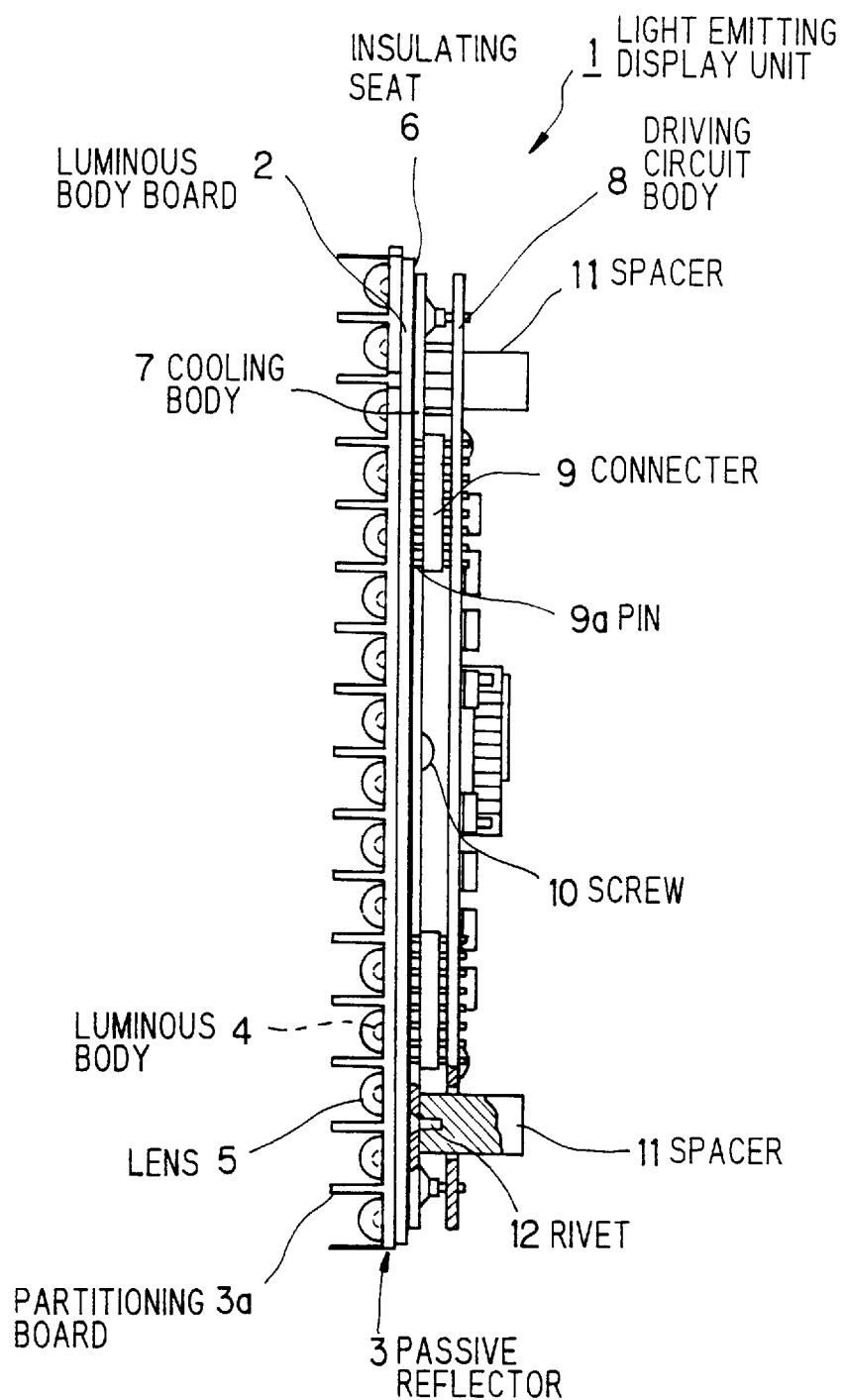
FIG. 3 is a right side view of the a light emitting display unit in a light emitting display apparatus embodying the present invention.

FIG. 3 is a right side view of a light emitting display unit in a light emitting display apparatus embodying the present invention. The light emitting display unit 1 has a luminous body board 2, a passive reflector 3, luminous bodies 4, lenses 5 corresponding with the luminous bodies 4, an insulating seat 6, a cooling body 7, and a driving circuit board 8. The passive reflector 3, the luminous bodies 4, and the lenses 5 are placed on a front side of the luminous body board 2. And the insulating seat 6, the cooling body 7, and the driving circuit board 8 are placed on a back side of the luminous body board 2.

The insulating seat 6 prevents connecting a distributing pattern of the luminous body board 2 with the cooling body 7 when the cooling body 7 is placed on the luminous body board 2. Further, the insulating seat 6 is formed by a material, such as a silicon, which excels in insulation, thermal proof, and thermal conduction. The size of the insulating seat 6 is about same as that of the luminous body board 2. Further, a part of circumference of the insulating seat 6 is cut for connector pins 9a to be connected to the luminous body board 2.

The cooling body 7 is formed by a material such as aluminum. Its size is about same as the size of the insulating seat 6 and its thickness is of 2 millimeters. The cooling body 7 is fixed on the passive reflector 3 with the insulating seat 6 and the luminous body board 2 by tap screws 10. Thus, holes are provided on the luminous body board 2 and the insulating seat 6, of which number is same as that of the tap screws 10, to align with the places of the tap screws 10 on the cooling body 7. The cooling body 7 has functions of cooling, preventing deformation (such as torsion) of the luminous body board 2, and keeping flatness of the luminous body board 2. Four spacers 11 are mounted on four corners of the cooling body 7 by four rivets 12. The spacers 11 are cylindrical and their surfaces are coated by resin. The luminous body board 2 is kept to be flat and an electrical failure is prevented by the cooling body 7, because the deformation of the luminous body board 2 is corrected by placing the cooling body 7 when the luminous body board 2 tends to be deformed by heat. Further, the decrease of visibility is prevented by keeping it flat. An over-heat of the luminous body board 2 is prevented by the cooling function of the cooling body 7.

The luminous body board 2 is formed by a material such as glass epoxy resin. One character is displayed by 16×16 (m×n) dots on the luminous body board 2, so that four characters are displayed by four light emitting display units 1. Connecters 9 are placed on the back side of the luminous body board 2 to be connected with the control circuit of the driving circuit board 8.

Figure 4:
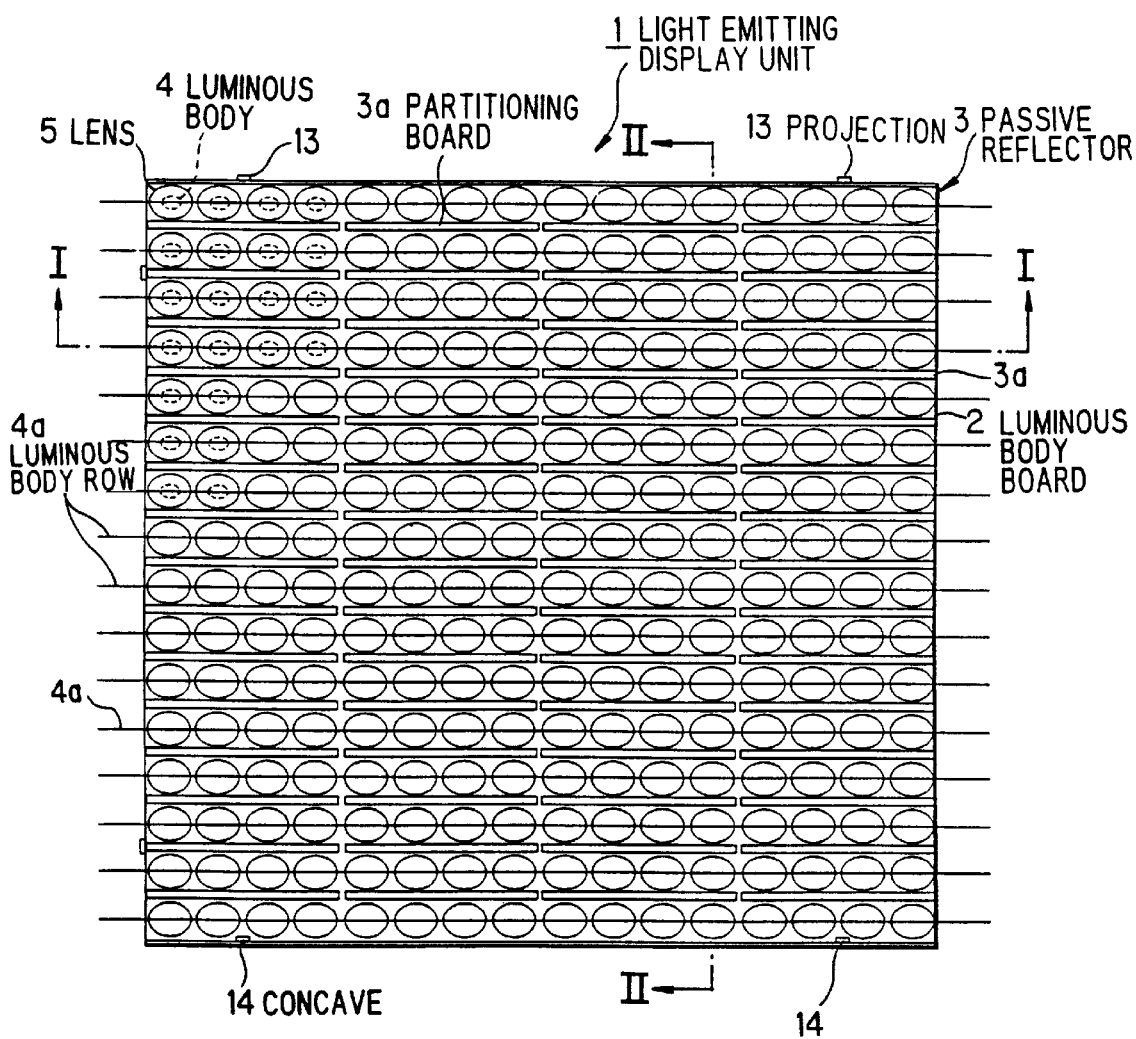
FIG. 4 is a front view of the light emitting display unit of the present invention.

FIG. 4 is a front view of the light emitting display unit of the present invention. Rows composed of the luminous bodies (luminous body rows 4a) are placed on a front side of the luminous body board 2. In this detailed description of the preferred embodiments, the luminous bodies 4 are mounted in matrix or zigzag of 16×16 on the front side of the luminous body board 2 in the form of chip on board (COB), or a discrete circuit. A light emitting face of each of the luminous bodies 4 is covered by a lens 5.

When a displaying area of the light emitting display apparatus is required to be enlarged, the luminous body boards 4 are connected with each other in length and width. Two projections 13 are provided on each of two sides of the passive reflector 3 to determine the jointing positions, and two concaves 14 are provided on each of other two sides of the passive reflector 3.

The size of the passive reflector 3 is same as that of the surface of the luminous body board 2 (for example, 144 millimeters×144 millimeters). The passive reflector 3 is formed by a material of black resin provided with climate proof and treated to have a shining surface. Further, partitioning boards 3a (for example, its height is of 8–10 millimeters) of resin are placed on the surface of the passive reflector 3 with an equal interval.

Figure 5:
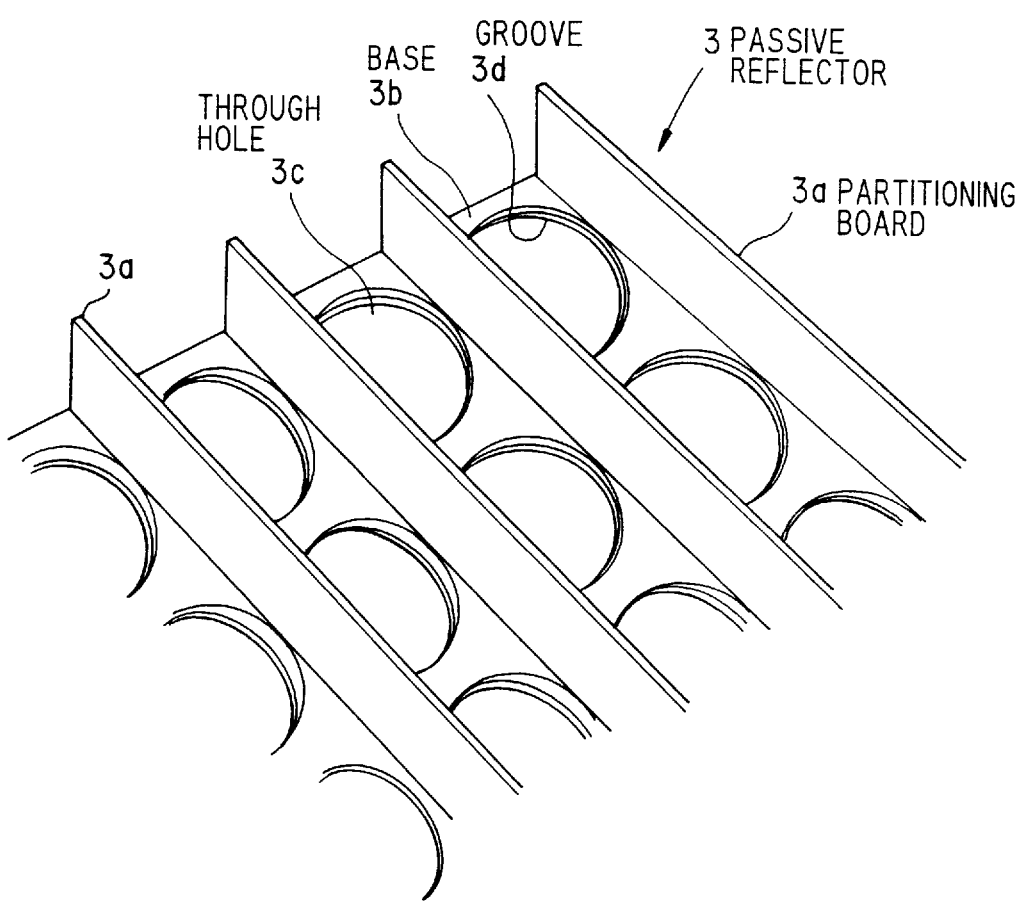
FIG. 5 is an enlarged schematic perspective view of a passive reflector.

FIG. 5 is an enlarged schematic perspective view of a passive reflector. The passive reflector 3 has partitioning boards 3a and a base 3b. The base 3b has through holes 3c and grooves 3d. The partitioning boards 3a are placed on the base 3b. Each of the through holes 3c is formed through the base 3b with an equal interval. The place of the lens 5 is determined by the place of the trough hole 3c. The diameter of the groove 3d is slightly larger than the diameter of the through hole 3c, so that the lens 5 is held.

Figure 6:
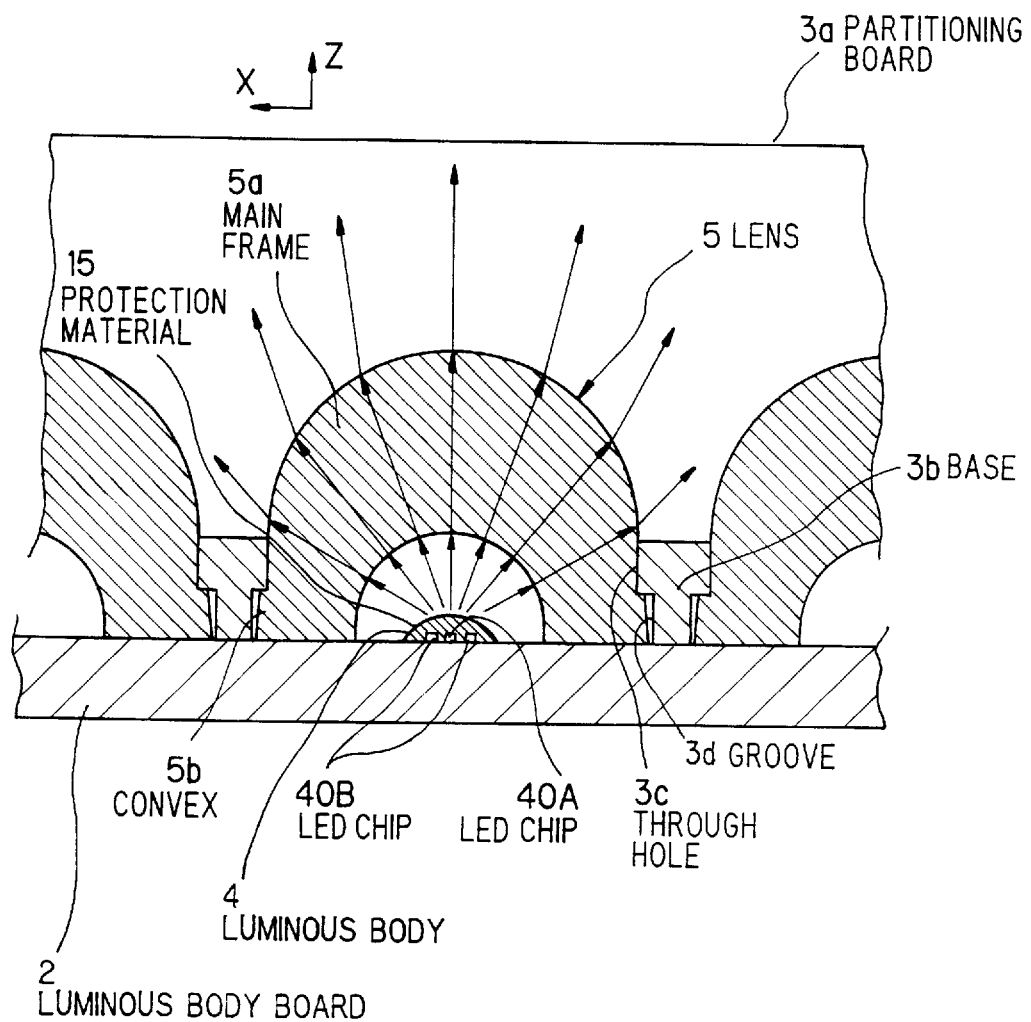
FIG. 6 is a partly sectional fragmentary schematic view of the light emitting display unit of the present invention and is taken along the line A—A of FIG. 4.
Figure 7:
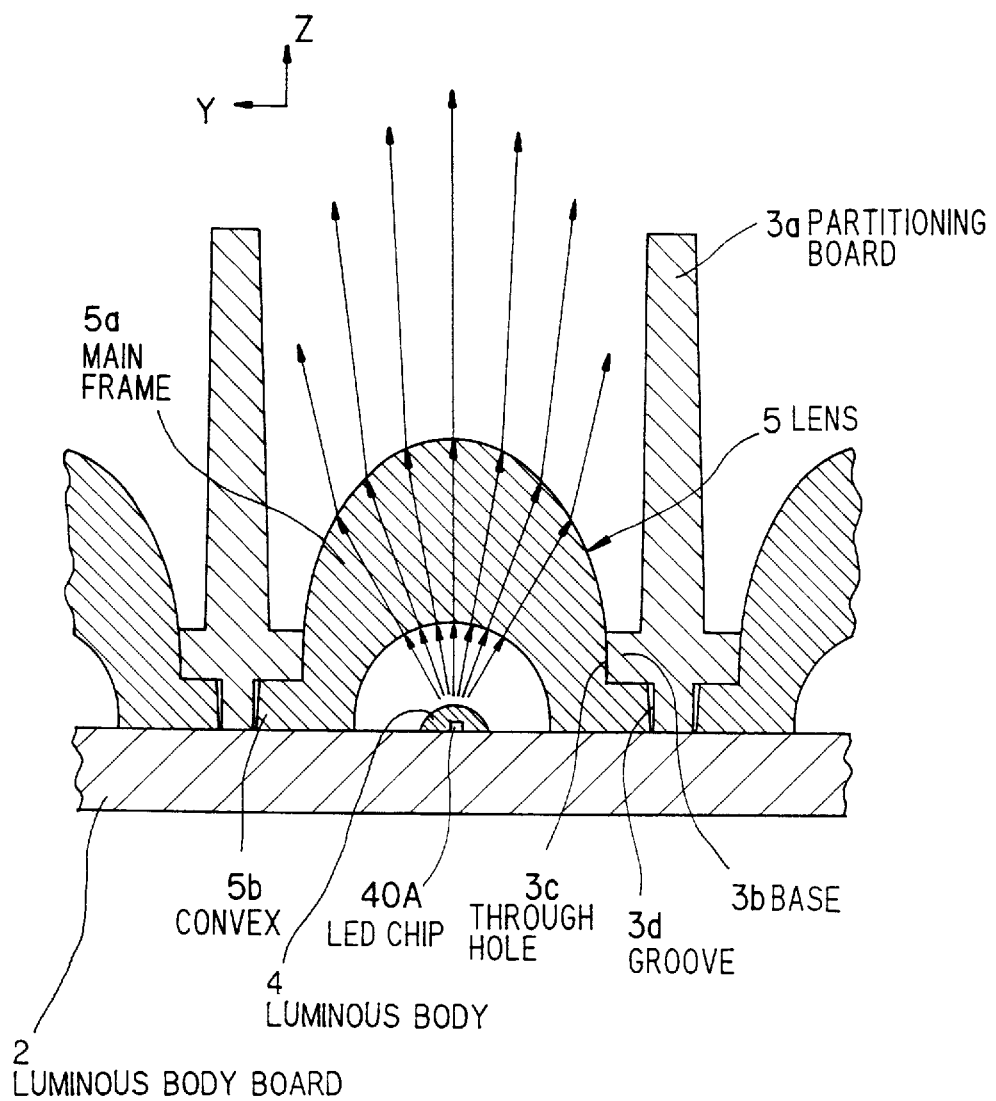
FIG. 7 is a partly sectional fragmentary schematic view of the light emitting display unit of the present invention and is taken along the line B—B of FIG. 4.

FIG. 6 is a partly sectional fragmentary schematic view of the light emitting display unit of the present invention and is taken along the line A—A of FIG. 4. FIG. 7 is a partly sectional fragmentary schematic view of the light emitting display unit of the present invention and is taken along the line B—B of FIG. 4. The luminous body 4 is fixed on the front side of the luminous body board 2 by a silver paste and the center of the luminous body 4 is aligned with the center of the lens 5 (see FIGS. 6 and 7).

The luminous body 4 has at least two LED chips (40A, 40B) as luminous elements. The LED chips (40A, 40B) are provided for the luminous body row 4a. A color of the LED chip 40A is different from a color of the LED chips 40B. In FIG. 6, the luminous color of the LED chip 40A is blue (B) or red (R). The luminous color of the LED chips 40B is yellow (Y) or (bluish-)green (G). The center of the LED chip 40A is aligned with the center of lens 5. The LED chips 40B are positioned on the both sides of the LED chip 40A. All of the LED chips (40A, 40B) are coated with a protection material 15 such as silicon or epoxy resin. The protection material 15 is not only protecting the LED chips 40A, 40B but also expanding a critical angle for the LED chips 40A, 40B, so that an output light is increased up and a luminous efficiency of the LEDs is enhanced.

In FIGS. 6 and 7, the lens 5 has a lens main frame 5a which has a convex 5b at the outer bottom circumference thereof. The lens 5 is formed by a transparency plastic or a glass, and its shape is non-spherical to be approximately of an egg. The convex 5b is held by the groove 3d of the through hole 3c of the passive reflector 3 and is arranged in position on the surface of the luminous body board 2. Therefore, the lens 5 can be held without any fixing part such as an adhesive agent or a screw. In FIG. 6, the lens 5 expands the luminous light from the luminous body 4 in the direction of the luminous body row 4a (the X-Z plane). In FIG. 7, the lens 5 converges the luminous light from the luminous body 4 in the direction orthogonal to the luminous body row 4a (the Y-Z plane). If the lens 5 is formed by plastic, a predetermined shape is easily obtained, so that a predetermined light expanding and converging pattern can be designed and the lens 5 can be mass-produced. As a result, a visible angle of the display unit 1 is largely expanded in the horizontal direction.

Figure 8:
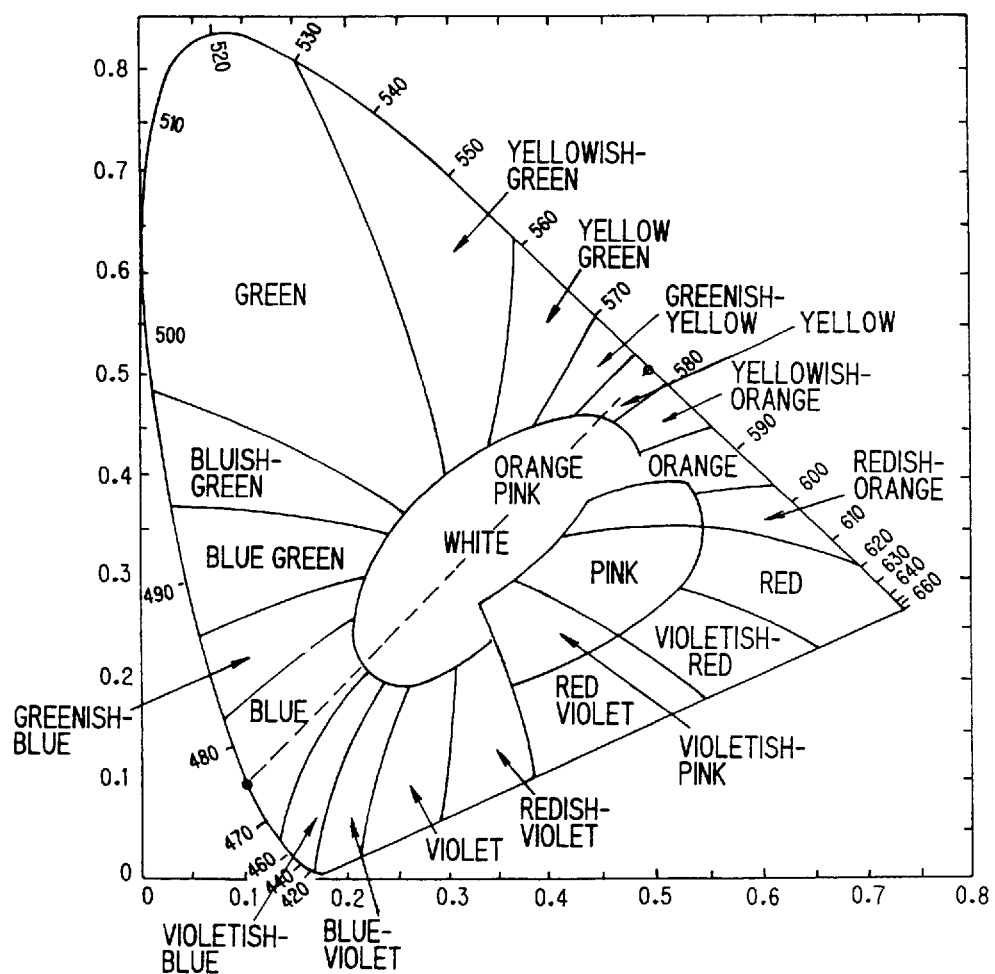
FIG. 8 is an x-y chromaticity diagram of the International Commission on Illumination (CIE)

FIG. 8 is an x-y chromaticity diagram of the International Commission on Illumination (CIE). In FIG. 8, if a yellow area is connected with blue aria (dotted line), the line runs through the center of a white area, so that a white color is obtained by controlling the luminous intensity of the blue LED chip 40A and the yellow LED chips 40B. For the white color luminous, the electric current of the yellow LED chips 40B is controlled relative to the electric current of the blue LED chip 40A. For this purpose, the electric current of the yellow and blue LED chips 40A, 40B may be relatively adjusted. Otherwise, the number of the yellow and blue LED chips 40A, 40B may be changed to provide a predetermined amount ratio of yellow and blue lights emitted therefrom. As a matter of course, the electric current of the LED chips 40A, 40B and the number thereof must be determined in accordance with a luminous intensity required for the light emitting display apparatus.

Figure 9:
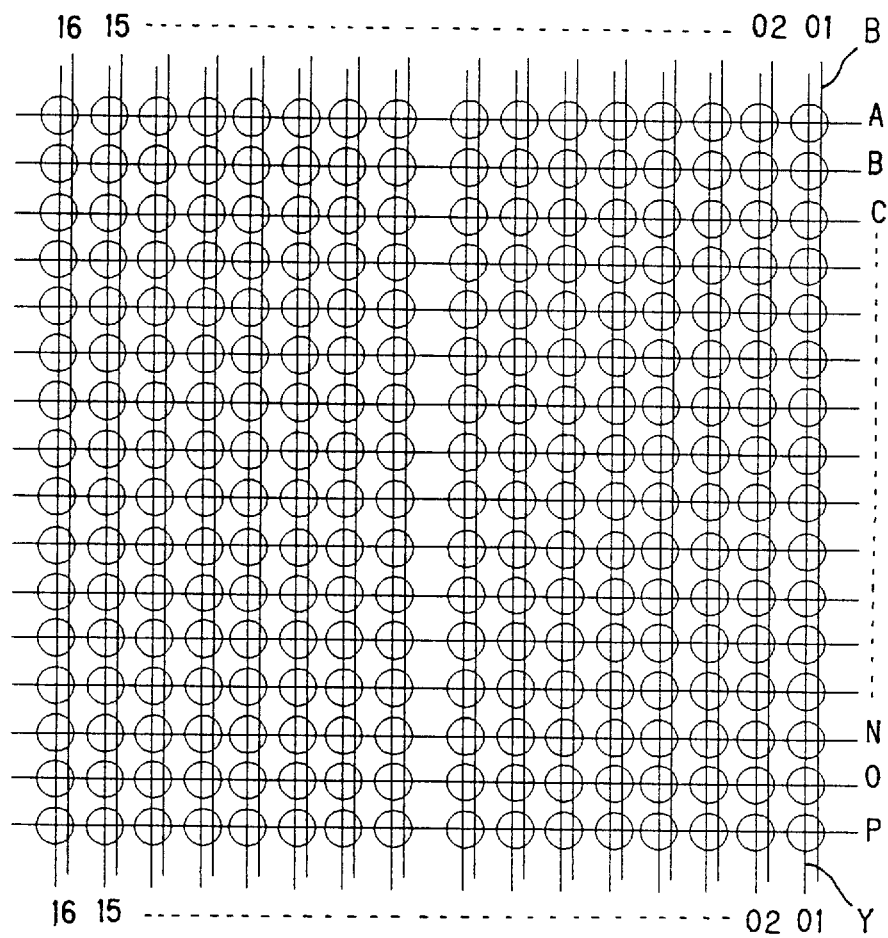
FIG. 9 is a circuit diagram of a LED dot matrix of the present invention.
Figure 10:
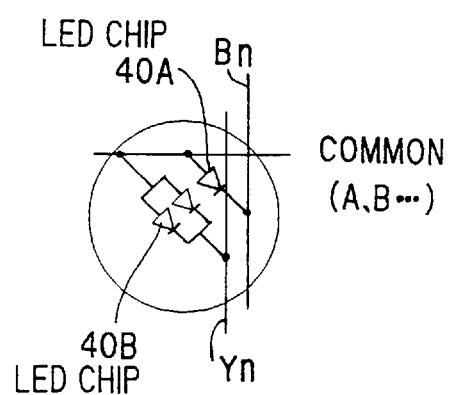
FIG. 10 is an explanatory diagram of one dot in the LED dot matrix of the present invention.

FIG. 9 is a circuit diagram of a LED dot matrix of the present invention. FIG. 10 is an explanatory diagram of one dot in the LED dot matrix of the present invention. The LED chips 40A, 40B (in FIG. 10) are mounted on the luminous body board 2 in matrix (in FIG. 9). In FIGS. 9 and 10, anode sides of the blue LED chip 40A and the yellow LED chips 40B are connected to a common line for one dot. Further, cathod sides of the blue LED chip 40A and the yellow LED chips 40B are connected individually to lines Bn and Yn. For example, the blue LED chip 40A is formed by a luminous material such as InGaN etc., and the yellow LED chip 40B is formed by a luminous material such as GaAsP or InGa AlP etc.

Figure 11:
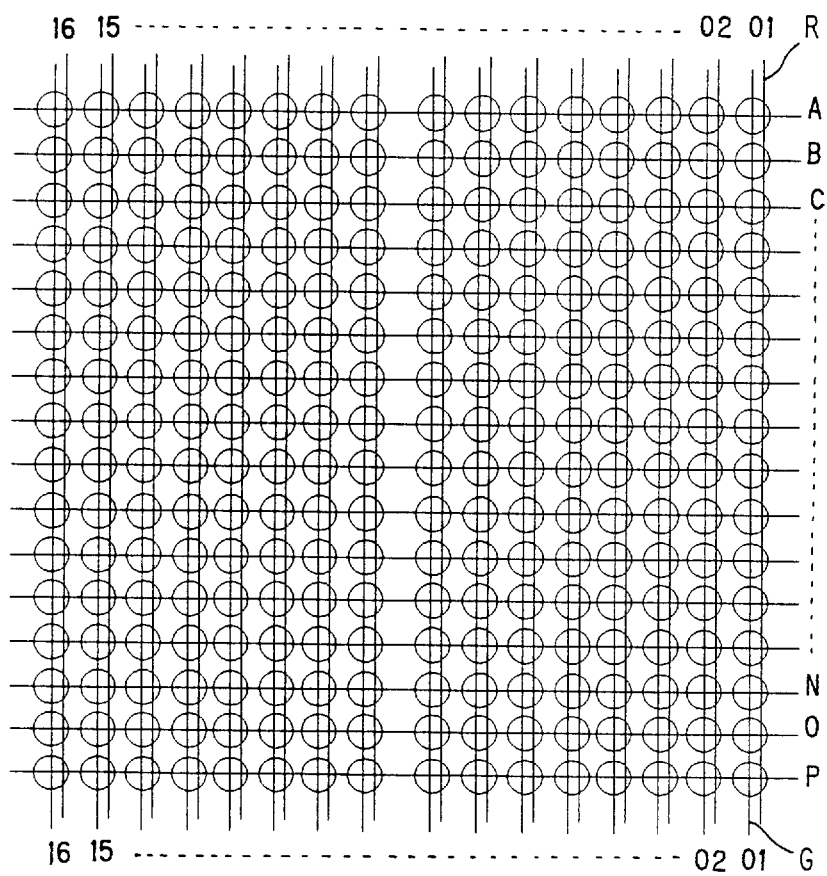
FIG. 11 is a circuit diagram of a LED dot matrix of the present invention.
Figure 12:
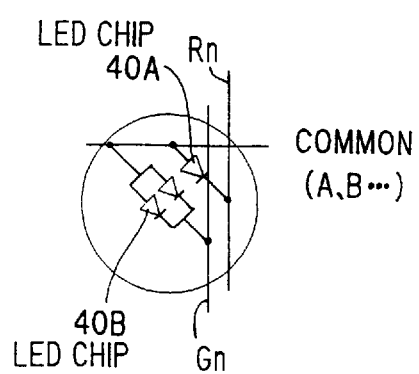
FIG. 12 is an explanatory diagram of one dot in the LED dot matrix of the present invention.

FIG. 11 is a circuit diagram of another LED dot matrix of the present invention. FIG. 12 is an explanatory diagram of one dot in the LED dot matrix of the present invention. The LED chips 40A, 40B (in FIG. 12) are mounted on the luminous body board 2 in matrix (in FIG. 11). In FIGS. 11 and 12, anode sides of the red LED chip 40A and the green LED chips 40B are connected to a common line for one dot. Further, cathod sides of the red LED chip 40A and the green LED chips 40B are connected individually to lines Rn and Gn.

Figure 13:
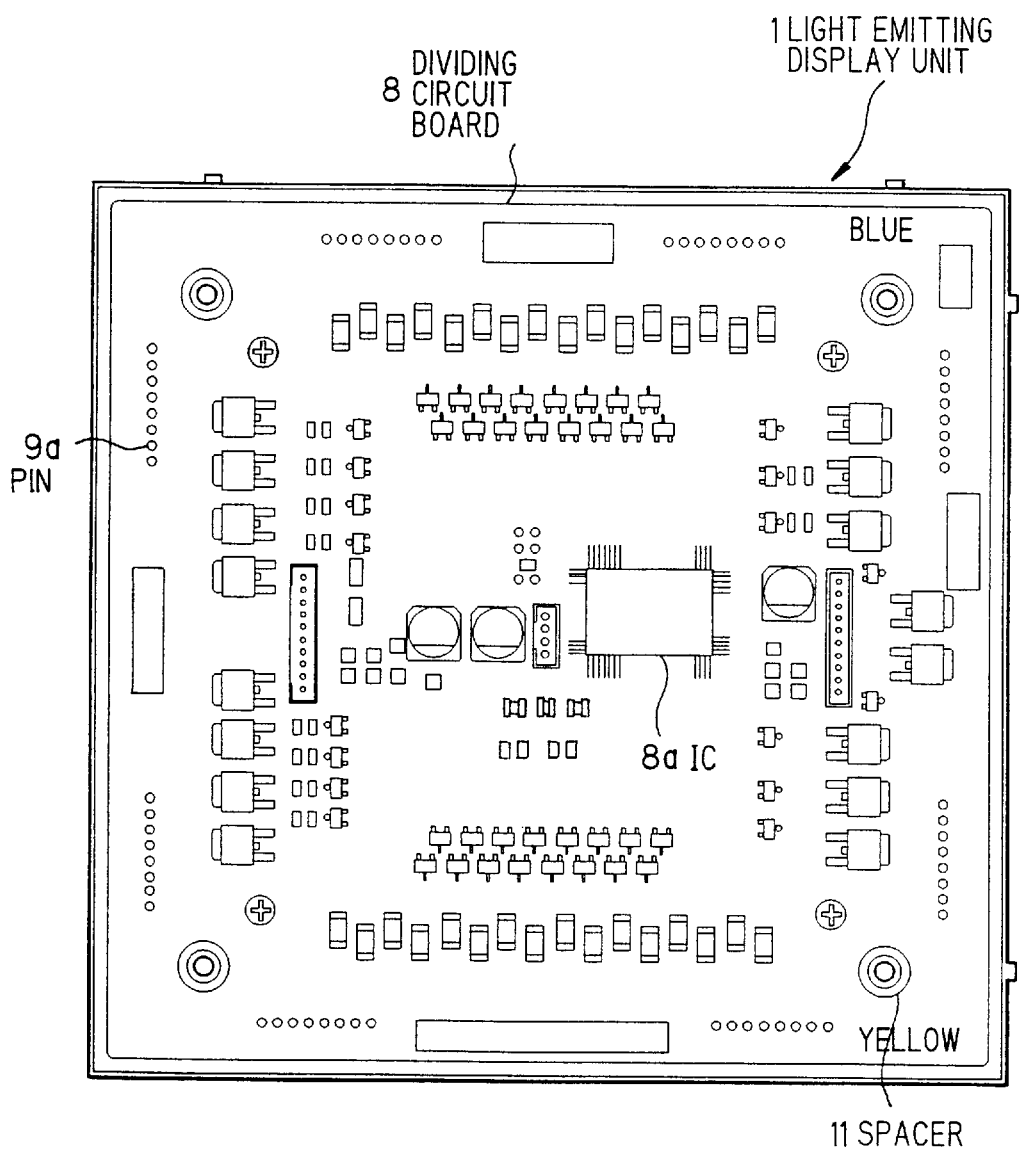
FIG. 13 is a rear view of the light emitting display apparatus of the present invention.
Figure 14:
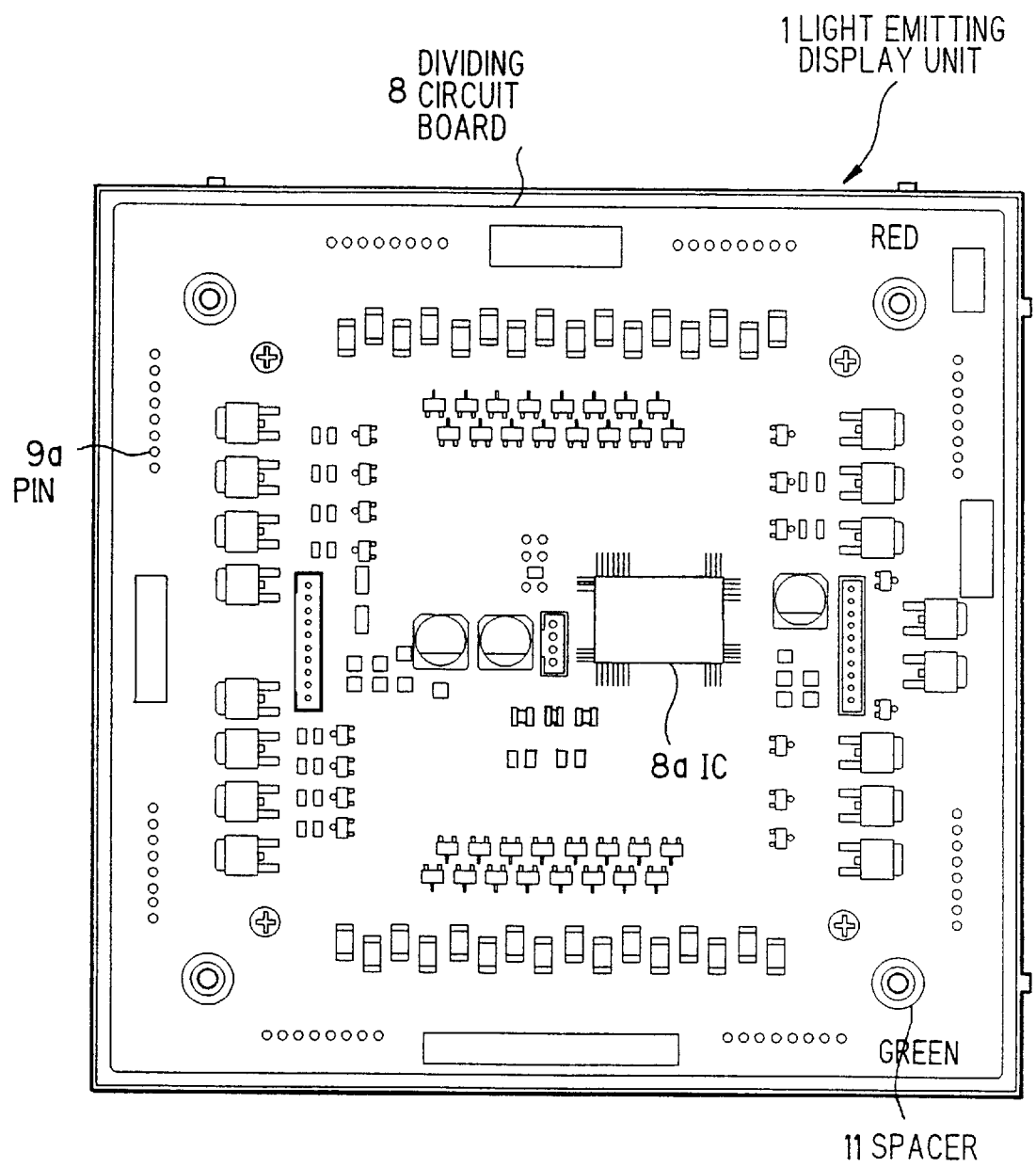
FIG. 14 is a rear view of the light emitting display apparatus of the present invention.

Each of FIGS. 13 and 14 is a rear view of the light emitting display unit 1 of the present invention. In FIGS. 13 and 14, a variety of electronic parts on the driving circuit board 8 are shown. The driving circuit board 8 is provided with a spacer 11 which serves for assembly as shown in FIG. 3. A driving circuit (driver) on the driving circuit board 8 drives the LED chips 40A, 40B to be turned on and off. In FIGS. 13 and 14, the driving circuit (driver) has an IC 8a.

Figure 15:
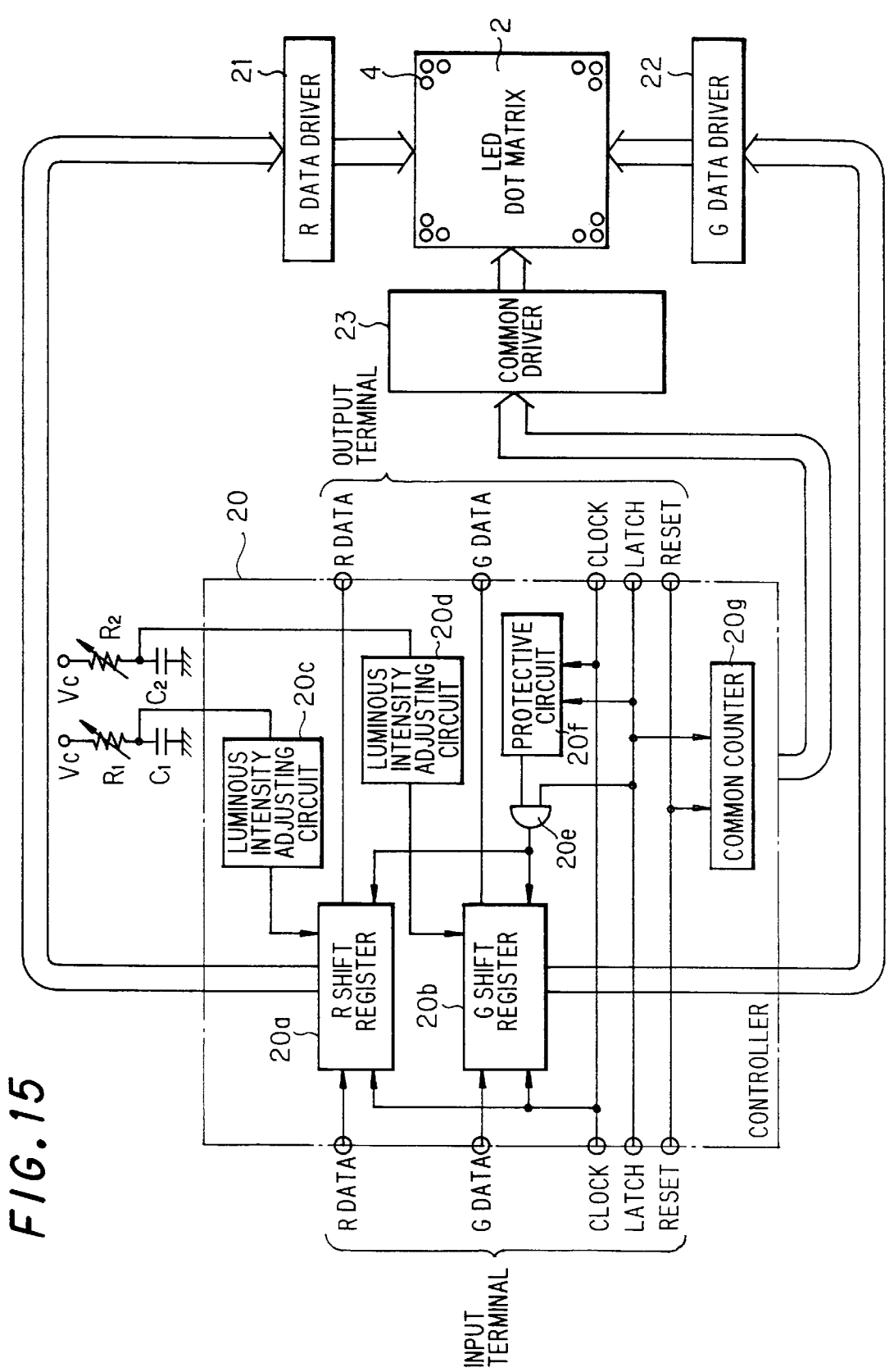
FIG. 15 is a circuit diagram of a driving circuit board having the red and green LED chips of the present invention.

FIG. 15 is a circuit diagram of a driving circuit board having the red and green LED chips of the present invention. The driving circuit drives the red and green LED chips on the luminous body board 2. The driving circuit has a controller 20, a R-data driver 21 to drive the red LED chips at cathodes, a G-data driver 22 to drive the green LED chips at cathodes, and a common driver 23 to drive the red and green LED chips at anodes. The controller 20 has a R-shift register 20a, G-shift register 20b, a luminous intensity adjusting circuit 20c for red, a luminous intensity adjusting circuit 20d for green, a protective circuit 20f, a common counter 20g, and an AND gate 20e. The R-shift and G-shift registers latch R-data and G-data serially inputted by a latch signal. The luminous intensity adjusting circuits 20c and 20d adjust the luminous intensity of the LED chip by controlling an output timing of the data from the R- and G-shift registers 20a and 20b corresponding with voltage divided values inputted from connection nodes between condensers (C1, C2) and resistances (R1, R2) of RC serial circuits connected with a power source Vc. Further, the protective circuit 20f outputs a light off signal to turn off the light within 2 millisecond, if the output of the latch signal is stopped. The common counter 20g counts the latch signal, and the counting value is reset by a reset signal. Further, an input side of the AND gate 20e is connected with a latch signal line and an output of the protective circuit 20f, and an output side of the AND gate 20e is connected with the R- and G-shift registers 20a 20b. One character is displayed by 16×16 dots on the luminous body board 2. For this structure, when a display apparatus is composed of the four light emitting display units 1 to display four characters, the four controllers 20 are used to be connected in tandem to each other. In this case, the output terminal of the first controller 20 is connected to the input terminal of the second controller 20, and the same connection is repeated between the second and third ones, and the third and fourth ones, so that the R- and G-data are supplied via the first to third R- and G-shift registers 20a and 20b to the fourth R- and G-shift registers 20a and 20b, and then to the third to first R- and G-shift registers 20a and 20b in the same manner, while the clock, latch and reset signals are commonly used for the first to fourth controllers 20.

Figure 16:
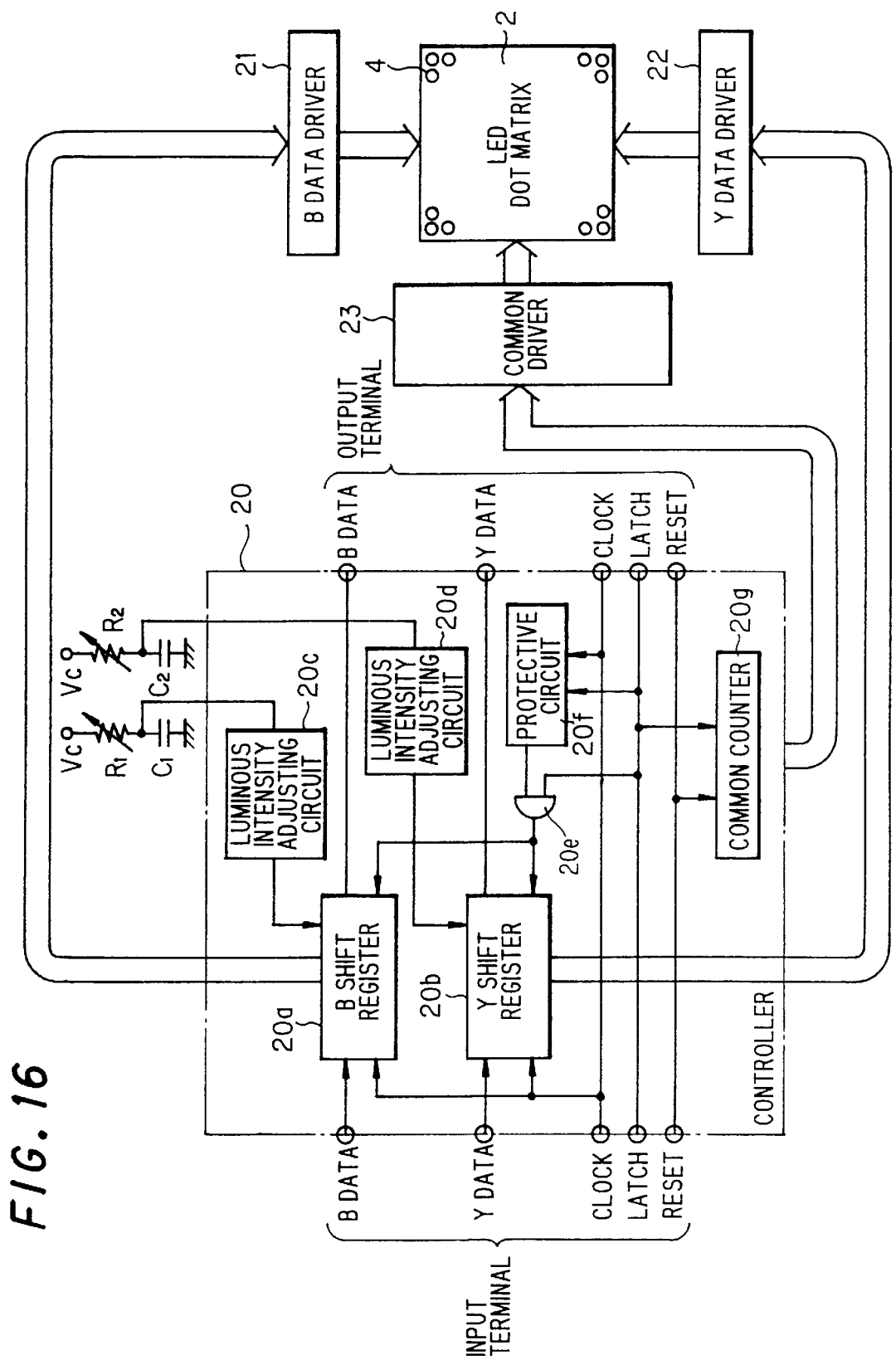
FIG. 16 is a circuit diagram of the driving circuit board having the blue and yellow LED chips of the present invention.

FIG. 16 is a circuit diagram of the driving circuit board having the blue and yellow LED chips of the present invention. The driving circuit drives the blue and yellow LED chips on the luminous body board 2. The driving circuit has a controller 20, a B-data driver 21 to drive the blue LED chips at cathodes, a Y-data driver 22 to drive the yellow LED chips at cathodes, and a common driver 23 to drive the blue and yellow LED chips at anodes. The controller 20 has a B-shift register 20a, Y-shift register 20b, a luminous intensity adjusting circuit 20c for blue, a luminous intensity adjusting circuit 20d for yellow, a protective circuit 20f, a common counter 20g, and an AND gate 20e. The B-shift and Y-shift registers latch B-data and Y-data serially inputted by a latch signal. The luminous intensity adjusting circuits 20c and 20d adjust the luminous intensity of the LED chip by controlling an output timing of the data from the B- and Y-shift registers 20a and 20b corresponding with voltage divided values inputted from a connection nodes between condensers (C1, C2) and resistances (R1, R2) of RC serial circuits connected with a power source Vc. Further, the protective circuit 20f outputs a light off signal to turn off the light within 2 millisecond, if the output of the latch signal is stopped. The common counter 20g counts the latch signal, and the counting value is reset by a reset signal. Further, an input side of the AND gate 20e is connected with a latch signal line and an output of the protective circuit 20f, and an output side of the AND gate 20e is connected with the B- and Y-shift registers 20a 20b. One character is displayed by 16×16 dots on the luminous body board 2. For this structure, when a display apparatus is composed of the four light emitting display units 1 to display four characters, the four controllers 20 are used to be connected in tandem to each other. In this case, the output terminal of the first controller 20 is connected to the input terminal of the second controller 20, and the same connection is repeated between the second and third ones, and the third and fourth ones, so that the B- and Y-data are supplied via the first to third B- and Y-shift registers 20a and 20b to the fourth B- and Y-shift registers 20a and 20b, and then to the third to first B- and Y-shift registers 20a and 20b in the same manner, while the clock, latch and reset signals are commonly used for the first to fourth controllers 20. Therefore, the driver circuit selectively drives the luminous bodies 4 on the luminous body board 2. If a white color displaying mode is selected, an image character is displayed at white color by lighting the both luminous of the blue and yellow LED chips of the luminous body 4 at a predetermined luminous intensity ratio (a:b). If a plural colors-displaying mode is selected, an image character is displayed at any color determined by a luminous intensity ratio (c:d; c and d may include 0) of the blue and/or yellow LED chips which is different from the white color luminous intensity ratio (a:b; a and b do not include 0).

Next, operation of the light emitting display apparatus will be explained in FIG. 17, when the white color displaying mode is selected.

Figure 17:
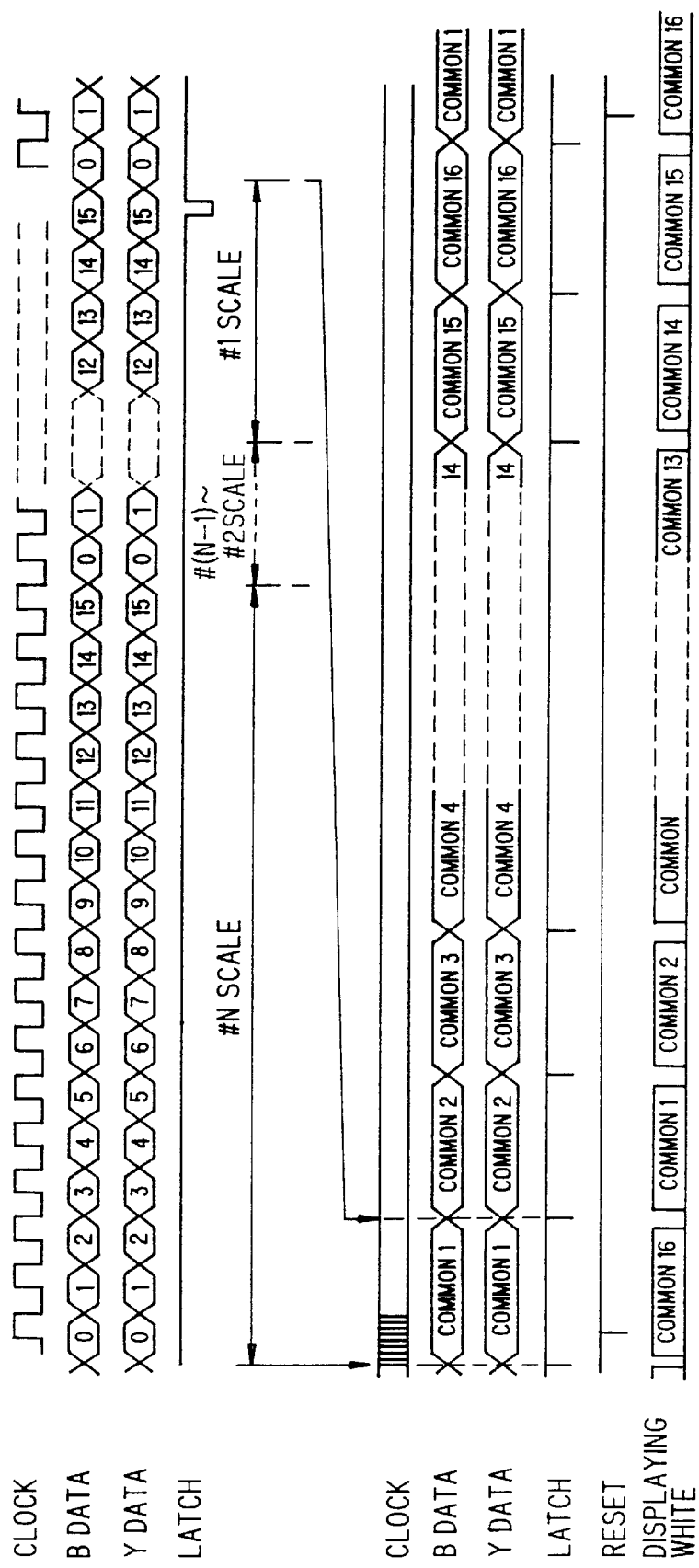
FIG. 17 is a timing chart of explaining operation of the light emitting display apparatus having four light emitting display units including the blue and yellow LED chips.

FIG. 17 is a timing chart of explaining operation of the light emitting display apparatus having four light emitting display units including the blue and yellow LED chips. N is the number of the light emitting display unit(s) 1 having the above LED 16×16 matrix. In this case, when the N is four, four characters are displayed. At first, the controller 20 inputs clock signals at a clock terminal and inputs serially B-data and Y-data at B-terminal and Y-terminal. The B-data and Y-data of 1 to 4 scales are of 16 bits. Each set of the B-data and Y-data of the first to fourth scales is assigned to each one of the first to fourth display units 1, in which the B-data and Y-data will be held in the B- and Y-shift registers 20a and 20b, respectively. At this time, the latch signal becomes low, so that the scanning is progressed from the common 1 to the common 2 for the common counter 20g to count "1". Then, when the latch signal becomes high, the B-data and Y-data are latched in latch regions of the B- and Y-shift registers 20a and 20b to be supplied to the B- and Y-data drivers 21 and 22 in accordance with output instructions from the AND gate 20e. The supply of the B- and Y-data to the B- and Y-data drivers 21 and 22 is kept for a time period during which intensity-adjusting signals are supplied from the luminous intensity adjusting circuits 20c and 20d to the B- and Y-shift registers 20a and 20b. At this time, anodes of the B- and Y-LED chips 40A and 40B are driven to emit blue and yellow lights by the common driver 23 at a line of the display unit 1 corresponding to the counted value "1" of the common counter 20g. During this driving period, the B-data and Y-data of 16 bits×four units for next line corresponding to the common 2 are supplied to shift regions of the B- and Y-shift registers 20a and 20b, and the same operation is repeated. In this manner, the counted value of the common counter 20g becomes "16", one display cycle of the display unit 1 having 16×16 pixels is finished.

Next, operation of the light emitting display apparatus will be explained in FIG. 18, when the white color displaying mode is selected.

Figure 18:
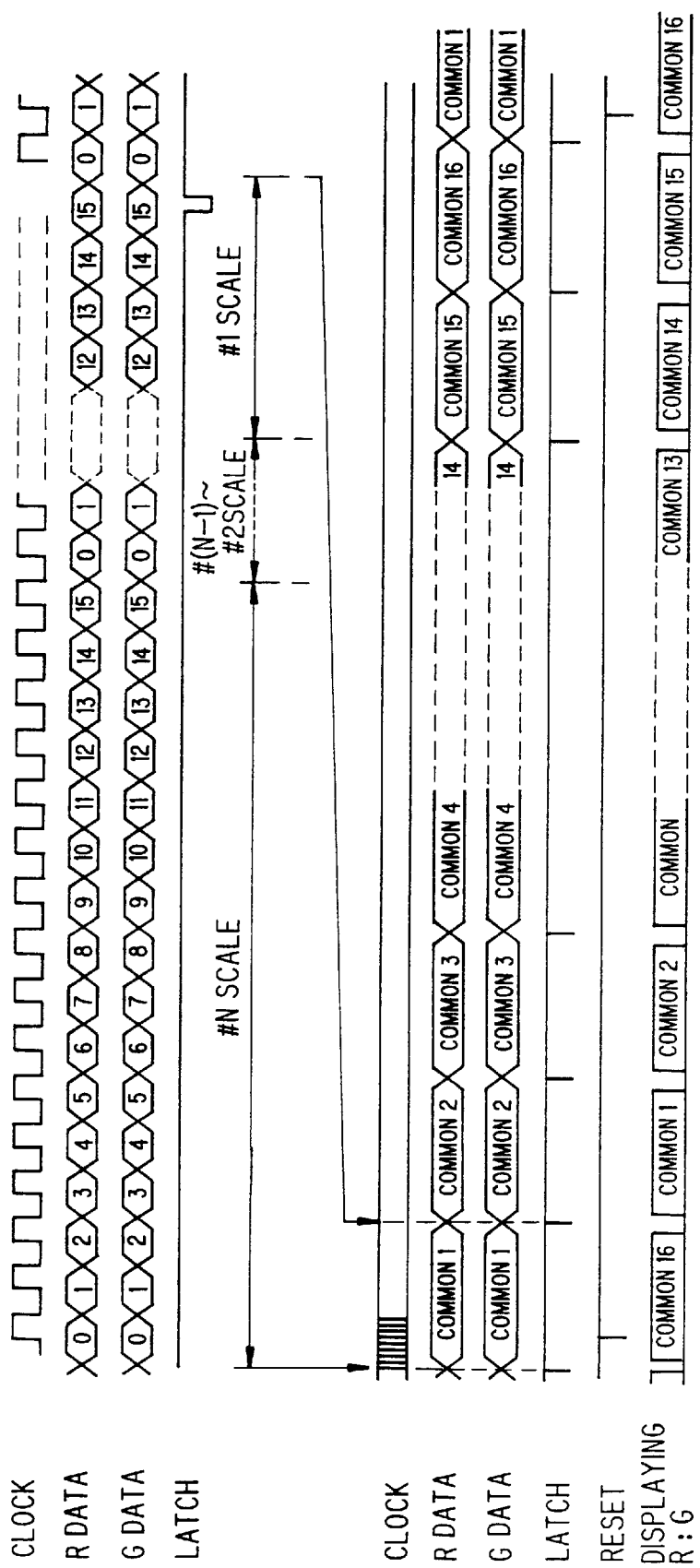
FIG. 18 is a timing chart of explaining operation of the light emitting display apparatus having four light emitting display units including the red and green LED chips.

FIG. 18 is a timing chart of explaining operation of the light emitting display apparatus having four light emitting display units including the red and green LED chips. N is the number of the light emitting display unit(s) 1 having the above LED 16×16 matrix. In this case, when the N is four, four characters are displayed. At first, the controller 20 inputs clock signals at a clock terminal and inputs serially R-data and G-data at R-terminal and G-terminal. The R-data and G-data of 1 to 4 scales are of 16 bits. Each set of the R-data and G-data of the first to fourth scales is assigned to each one of the first to fourth display units 1, in which the R-data and G-data will be held in the R- and G-shift registers 20a and 20b, respectively. At this time, the latch signal becomes low, so that the scanning is progressed from the common 1 to the common 2 for the common counter 20g to count "1". Then, when the latch signal becomes high, the R-data and G-data are latched in latch regions of the R- and G-shift registers 20a and 20b to be supplied to the R- and G-data drivers 21 and 22 in accordance with output instructions from the AND gate 20e. The supply of the R- and G-data to the R- and G-data drivers 21 and 22 is kept for a time period during which intensity-adjusting signals are supplied from the luminous intensity adjusting circuits 20c and 20d to the R- and G-shift registers 20a and 20b. At this time, anodes of the R- and B-LED chips 40A and 40B are driven to emit red and green lights by the common driver 23 at a line of the display unit 1 corresponding to the counted value "1" of the common counter 20g. During this driving period, the R-data and G-data of 16 bits×four units for next line corresponding to the common 2 are supplied to shift regions of the R- and G-shift registers 20a and 20b, and the same operation is repeated. In this manner, the counted value of the common counter 20g becomes "16", one display cycle of the display unit 1 having 16×16 pixels is finished.

Figure 20:
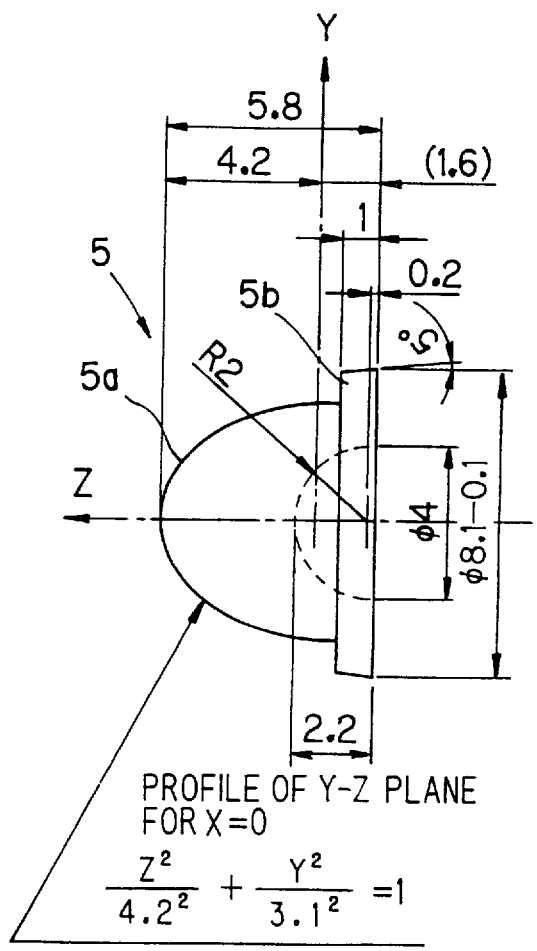
FIG. 20 is a sectional view of the lens of the present invention and is taken along the Y-Z plane.
Figure 21:
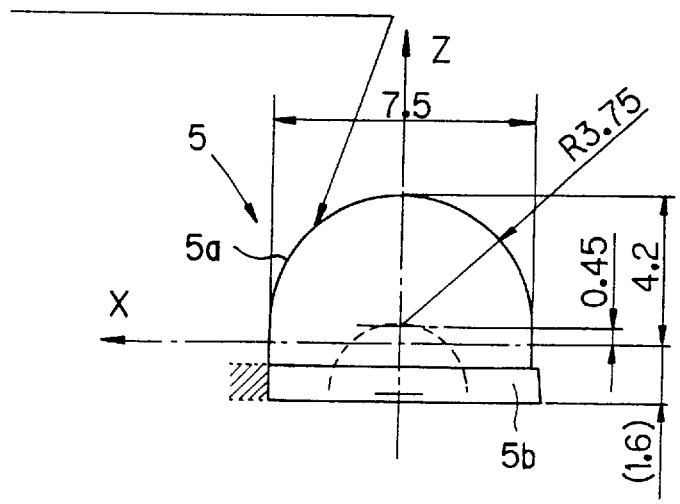
FIG. 21 is a sectional view of the lens of the present invention and is taken along the Z-X plane.

FIG. 19 is a sectional view of a lens of the present invention and is taken along the X-Y plane. FIG. 20 is a sectional view of the lens of the present invention and is taken along the Y-Z plane. FIG. 21 is a sectional view of the lens of the present invention and is taken along the Z-X plane.

In FIG. 19, the X-diameter of the convex 5b of the main frame 5a of the lens 5 is of 7.5 millimeters and its Y-diameter is of 6.2 millimeters, so that it is an elliptic form. In FIG. 20, the outline of the main frame 5a of the lens 5 is a half elliptic form of which pitch is of 5.8 millimeters. The inline of the main frame 5a of the lens 5 is a semicircle (dome) from of which radius is of 2 millimeters. In FIG. 21, the inline of the main frame 5a of the lens 5 is a semicircle (dome) from of which radius is of 3.75 millimeters.

Figure 22:
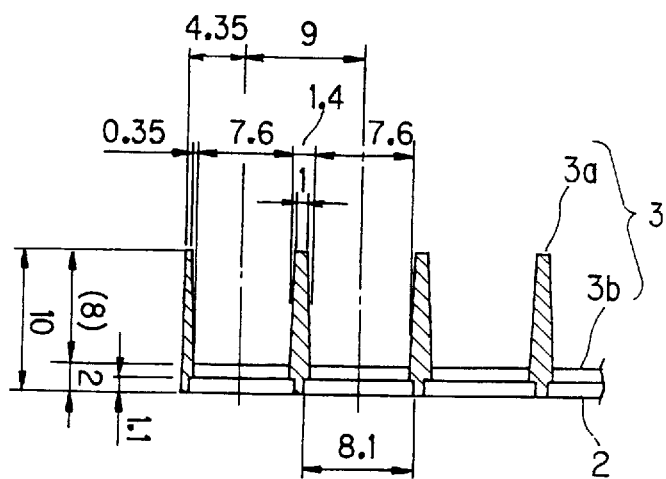
FIG. 22 is a partly sectional view of a passive reflector of the present invention.

FIG. 22 is a partly sectional view of a passive reflector of the present invention. Pitch of the partitioning board 3a of the passive reflector 3 is of 8 millimeters from the base 3b of the passive reflector 3. Space from one partitioning board 3a to the next partitioning board 3a is of 8.1 millimeters. It is the same as the maximum diameter of the lens 5. The pitch of the lens 5 is of 5.8 millimeters less than the pitch of the partitioning board 3a, so that the partitioning board 3a does not effect on the image recognition of the light emitting display apparatus.

Figure 23:
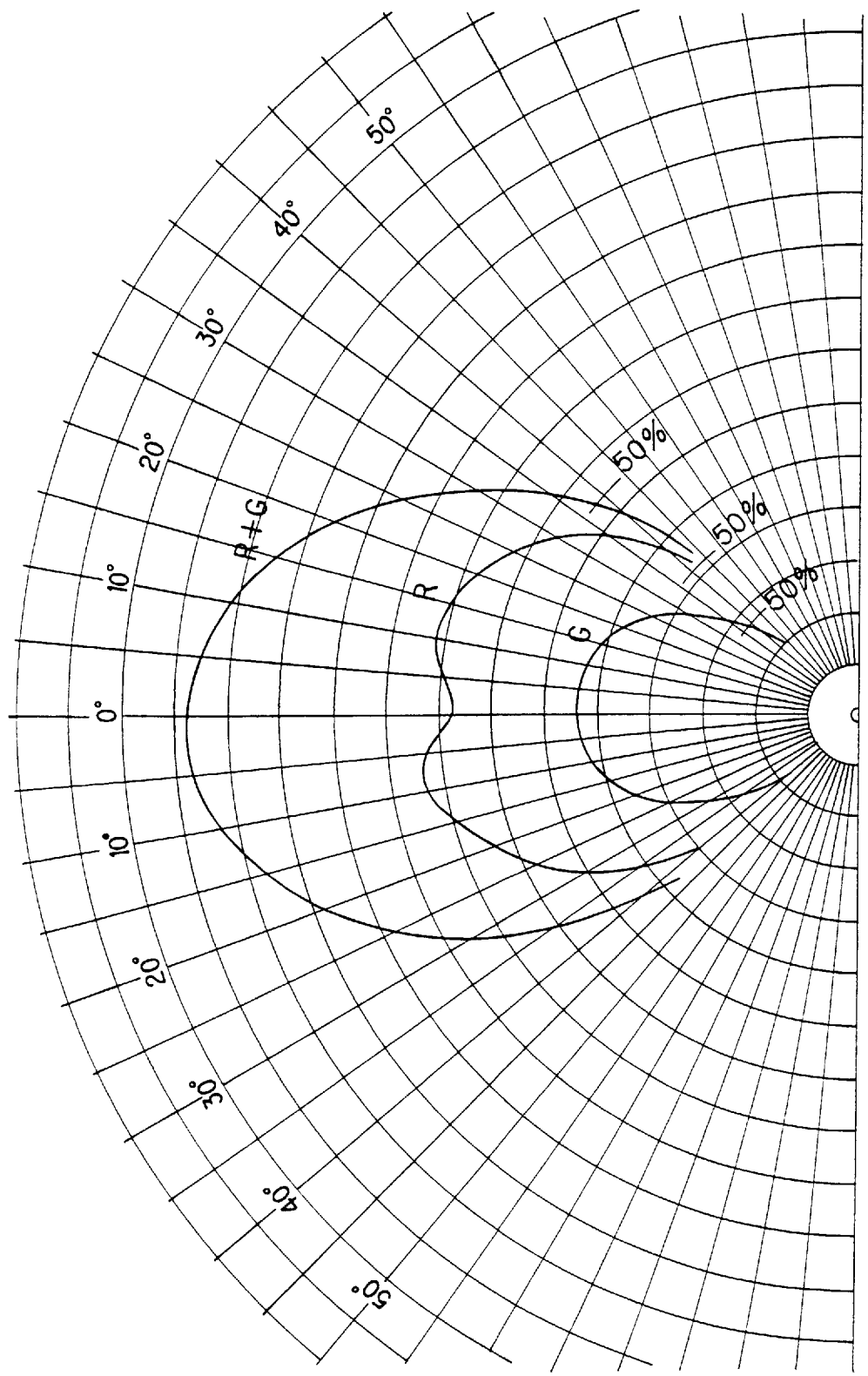
FIG. 23 is a diagram of a directional pattern of the lens of the present invention and is taken along the horizontal plane.

FIG. 23 is a diagram of a directional pattern of the lens of the present invention and is taken along the horizontal plane. FIG. 24 is a diagram of the directional pattern of the lens of the present invention and is taken along the vertical plane. The directional patterns of the expanded configuration at the Z-X plane and the diverging configuration at the Y-Z plane are obtained by combining the passive reflector 3 in FIG. 22 and the lens 5 in FIGS. 19 to 21.

As this invention may be embodied in several forms without departing from the sprit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds are therefore intended to embraced by the claims.

We claim:

1. A light emitting display apparatus, comprising:
a plurality of pixels arranged in a plurality of rows to display a predetermined image, each of said plurality of pixels being composed of one or more light emitting diodes;
a plurality of lenses provided on said plurality of pixels, each of said plurality of lenses horizontally expanding lights emitted from said one or more light emitting diodes, and vertically conversing said lights; and
a plurality of partitioning boards each provided between two adjacent rows of said plurality of rows, said plurality of partitioning boards being higher than said plurality of lenses.

2. The light emitting display apparatus, according to claim 1, wherein:
each of said plurality of pixels has at least two luminous chips; and
a luminous color of one of said luminous chips is different from that of other luminous chips.

3. The light emitting display apparatus, according to claim 1, wherein:
each of said plurality of pixels has at least two luminous chips; and
a luminous color of one of said luminous chips is different from that of other luminous chips.

4. A light emitting display apparatus, comprising:
a plurality of pixels to display a predetermined image, each of said plurality of pixels being composed of red and green light emitting diodes and having no light emitting diode of a color other than red and green; and
means for driving said red and green light emitting diodes to be turned on in accordance with predetermined light intensities, thereby representing various colors including a white color.

5. A light emitting display apparatus, comprising:
a plurality of pixels to display a predetermined image, each of said plurality of pixels being composed of blue and yellow light emitting diodes and having no light emitting diode of a color other than blue and yellow; and
means for driving said blue and yellow light emitting diodes to be turned on in accordance with predetermined light intensities, thereby representing various colors including a white color.

6. The light emitting display apparatus, according to claim 4, wherein:
said means for driving has a white color displaying mode to represent a white color by turning on both said red and green light emitting diodes in accordance with predetermined light intensities, and a plural colors displaying mode to represent any color other than said white color by turning on said red and/or green light emitting diodes in accordance with predetermined light intensities.

7. The light emitting display apparatus, according to claim 5, wherein:
said means for driving has a white color displaying mode to represent a white color by turning on both said blue and yellow light emitting diodes in accordance with predetermined light intensities, and a plural colors displaying mode to represent any color other than said white color by turning on said blue and/or yellow light emitting diodes in accordance with predetermined light intensities.

8. A light emitting display apparatus, comprising:
a plurality of pixels arranged in a plurality of rows to display a predetermined image, each of said plurality of pixels being composed of red and green light emitting diodes having no light emitting diode of a color other than red and green;
a plurality of lenses provided on said plurality of pixels, each of said plurality of lenses horizontally expanding lights emitted from said red and green light emitting diodes, and vertically converging said lights; and
means for driving said red and green light emitting diodes to be turned on in accordance with predetermined light intensities, thereby representing various colors including a white color.

9. A light emitting display apparatus, comprising:
a plurality of pixels arranged in a plurality of rows to display a predetermined image, each of said plurality of pixels being composed of blue and yellow light emitting diodes having no light emitting diode of a color other than blue and yellow;

a plurality of lenses provided on said plurality of pixels, each of said plurality of lenses horizontally expanding lights emitted from said blue and yellow light emitting diodes, and vertically converging said lights; and means for driving said blue and yellow light emitting diodes to be turned on in accordance with predetermined light intensities, thereby representing various colors including a white color.

10. The light emitting display apparatus, according to claim 8, wherein:

said means for driving has a white color displaying mode to represent a white color by turning on both said red and green light emitting diodes in accordance with predetermined light intensities, and a plural colors displaying mode to represent any color other than said white color by turning on said red and/or green light emitting diodes in accordance with predetermined light intensities.

11. The light emitting display apparatus, according to claim 9, wherein:

said means for driving has a white color displaying mode to represent a white color by turning on both said blue and yellow light emitting diodes in accordance with predetermined light intensities, and a plural colors displaying mode to represent any color other than said white color by turning on said blue and/or yellow light emitting diodes in accordance with predetermined light intensities.

* * * * *